United States Patent [19]

Masdea et al.

[11] 4,257,018

[45] Mar. 17, 1981

[54] AUTOMATIC TUNING CIRCUITS FOR VOLTAGE CONTROLLED FILTERS, BY DIGITAL PHASE CONTROL

[75] Inventors: Arturo Masdea; Giuseppe Quagliarello, both of Rome, Italy

[73] Assignee: Selenia Industrie Elettroniche Associate S.p.A., Italy

[21] Appl. No.: 26,973

[22] Filed: Apr. 4, 1979

[30] Foreign Application Priority Data

Apr. 18, 1978 [IT] Italy .................... 48946 A/78

[51] Int. Cl.³ .......................................... H03H 17/02
[52] U.S. Cl. .................................. 333/17 R; 328/167
[58] Field of Search ........................ 333/17 R; 328/167

[56] References Cited

U.S. PATENT DOCUMENTS

| | | | |
|---|---|---|---|
| 3,639,852 | 2/1972 | Boyer | 333/17 R X |
| 3,667,052 | 5/1972 | Effenberger | 333/17 R UX |
| 3,978,416 | 8/1976 | Sutphin, Jr. | 328/167 |
| 3,997,773 | 12/1976 | Van Essen et al. | 328/167 X |

Primary Examiner—Paul L. Gensler
Attorney, Agent, or Firm—Beveridge, De Grandi, Kline & Lunsford

[57] ABSTRACT

Automatic tuning circuit for voltage controlled filters, by digital phase control, including an oscillator and a path to be filtered associated with the voltage controlled filter, wherein the voltage controlled filter must be adjusted on a frequency equal or shifted by a preset amount with respect to the oscillator frequency, including means to scan the filter response while it is fed by the signal of the oscillator, means to detect the shift (positive or negative) of the filter response with respect to the oscillator frequency, means to measure in a digital way such a shift and arranged to provide a signal to correct the filter response, and means for digital storage of that correction signal.

1 Claim, 2 Drawing Figures

AUTOMATIC TUNING CIRCUITS FOR VOLTAGE CONTROLLED FILTERS, BY DIGITAL PHASE CONTROL

This invention relates to an improvement in automatic tuning circuits for voltage controlled filters, by digital phase control.

In particular this invention relates to a digital circuit which is able to automatically tune a voltage controlled filter (e.g. a YIG type filter or a Varicap filter) on the same frequency of a signal or on a frequency shifted by a selectable off-set $\Delta f$ and to maintain the desired tuning for an indefinite period of time.

Figure 1:
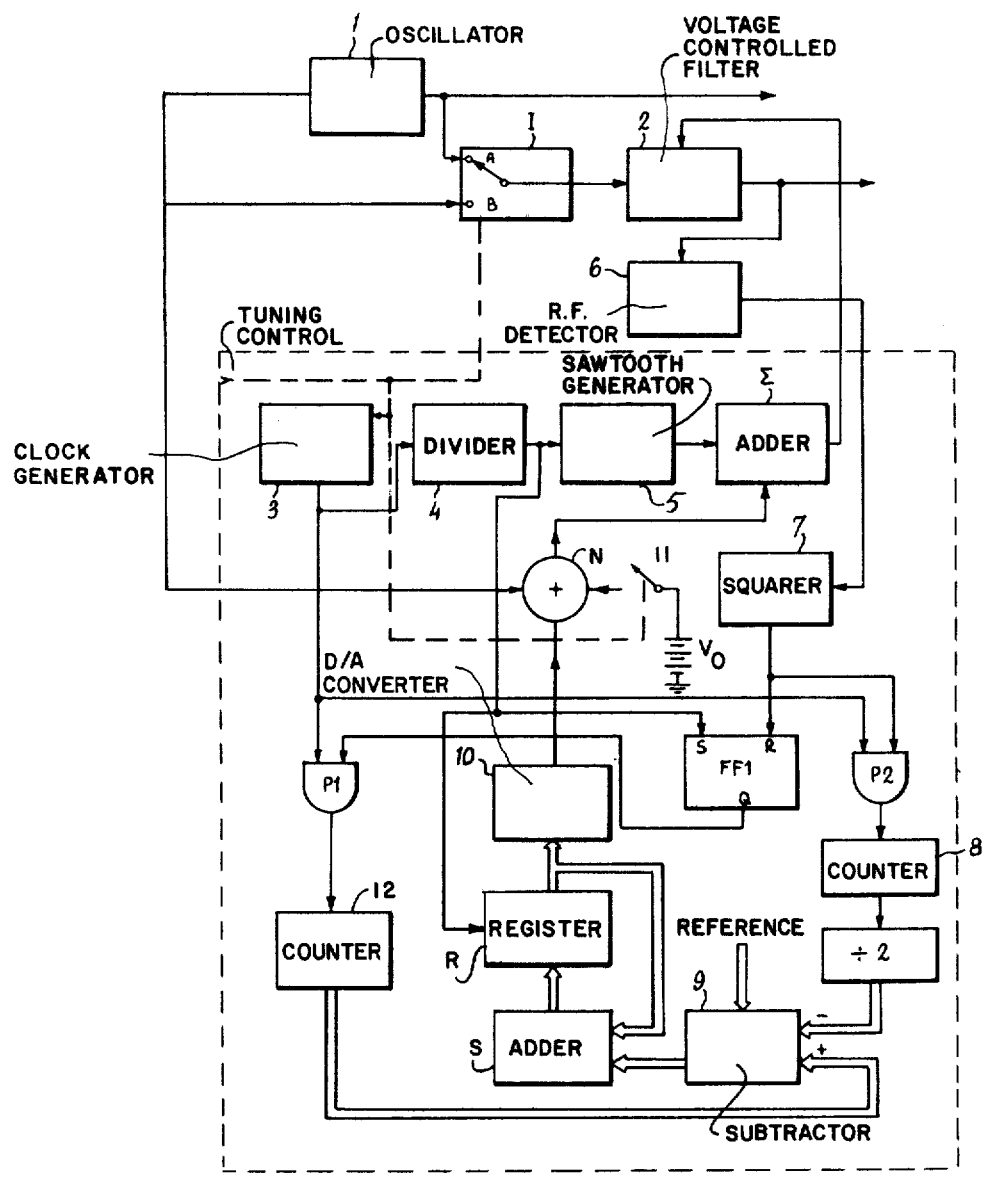
Figure 2:
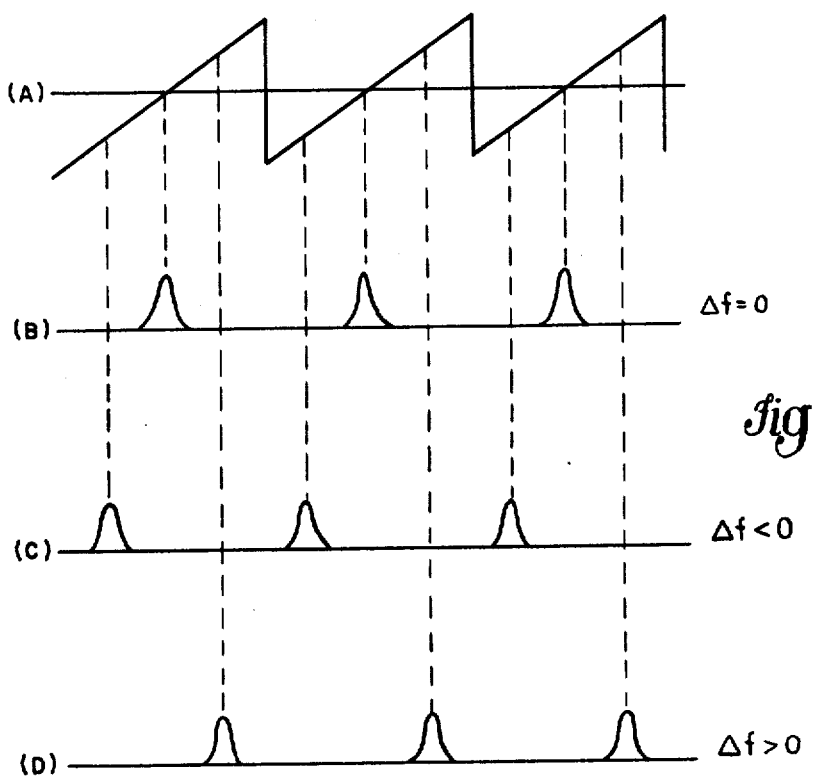

This invention will now be described with reference to a presently preferred embodiment, referred to as a non-limitative example and based on the attached figures, wherein:

FIG. 1 shows the general block diagram of the circuit according to the invention; and FIG. 2 shows wave forms which explain how the circuit in FIG. 1 does work.

With reference to FIG. 1 the part embodied in the dashed area indicates the object of this invention, while the oscillator 1, the switch I, the filter 2 and the radio frequency detector 6 are conventional devices whose characteristics depend upon the operating frequencies.

In particular there is an oscillator 1 which generates a specified frequency such as that of a local oscillator of a super-heterodyne, while the users are a mixer and a path to be filtered such as for example a receiver front-end, which has to be filtered at a frequency usually off-set by $\Delta f$ with respect to the frequency of the wave generated by the oscillator 1.

The circuit works in the following way.

In tuning search phase the operator operates the "tuning control," closing switch 11, to provide the desired frequency offset voltage from source $V_o$ to adder node N, and activating clock generator 3, while maintaining switch I in the A position, in which the oscillation produced by oscillator 1 output is passed through filter 2. Clock generator 3 generates a square-wave at a frequency which can range from a few KHz to some tens of KHz and depends upon the filter tuning changing rate and upon the quantization error desired on the tuning.

The frequency of the clock generator 3 is divided by an M-bit divider 4 in such a way as to obtain a square-wave signal at a relatively low frequency. This signal at the divider 4 output carries out three functions:

(a) it drives circuit 5 to generate a low frequency sawtooth, which passing through the analog adder $\Sigma$, scans the filter response during a $\Delta f_1$ interval selected as a function of the frequency range within which the tuning is looked for; that range is defined by the sawtooth signal amplitude and can be adjusted by means not shown;

(b) it presets at high level the output Q of bistable FF1, to enable the gate P1 to pass clock signals;

(c) it provides the storage signal to register R.

Due to the sweeping of the filter response controlled by the sawtooth signal, the oscillator 1 frequency periodically matches that filter, so that at the radio frequency detector 6 output connected to the filter 2 output, there will be a pulsed wave form with the same pattern of filter pass-band, the length of which is proportional to the sawtooth wave rate driving the filter tuning, the delay with respect to the sawtooth wave starting point depending upon the filter 2 out-of-tuning condition compared to the oscillator 1 frequency of oscillation. In particular, when filter 2 is centered with respect to oscillator 1, the lag is equal to half of a sawtooth period, while the lag is lower than this amount if the filter is lower tuned, and is higher if the filter is higher tuned. (These situations are shown in FIG. 2, where A indicates the sawtooth oscillation; B the time response of the filter tuned on the oscillator; C and D the filter out-of-tuning with respectively a negative and a positive $\Delta f$).

The radio frequency detector 6 output is squared in the squarer 7, and in correspondence with the rise of this square-wave, bistable FF1 is reset, the output Q of which goes to a logic zero, then disabling the gate P1 and blocking the clock pulse stream from the M-bit counter 12. In that way the M-bit counter acts as lag reader, i.e. as a phase discriminator.

It is to be noted that the square-wave coming from the squarer 7 has a length depending on the filter 2 form factor. To avoid the error introduced by square-wave finite length, coming from squarer 7, there is provided a second gate P2, a second M-bit counter 8 followed by a divide by 2 circuit which measures the square-shaped wave length. (The division by M and the subsequent division by 2 is provided as it is required to center the filter with respect to the oscillation of the oscillator 1).

The numeric word corresponding to such a length, divided by two, is subtracted in the binary subtractor circuit 9 from the tuning error to obtain the correct centering of a filter response.

The error is referred to the centered situation, corresponding to one-half of said lag.

The so corrected error is integrated by a digital integration circuit made by register R and binary adder S. The stored data are sent to digital-analog converter 10 which converts them to an analog voltage.

This voltage is sent to the analog adder node N and the output of this node is sent to the previously mentioned analog adder $\Sigma$.

In the adder node N can be added a frequency offset voltage obtained from voltage source $V_o$ after the locking of the loop has been accomplished, to provide a preset out-of-tuning of filter 2 with respect to oscillator 1.

When the tuning search phase is ended, switch I is repositioned on main path B, and the register R stores indefinitly the voltage value to be provided to the filter until a new "tuning control" is required.

Changes are possible in respect of the aforementioned. For example:

(a) oscillator 1 is a VCO (Voltage Controlled Oscillator) and a coarse preset of tuning is obtained;
(b) oscillator 1 is a VCO and the automatic tuning control is fed-back to the same oscillator instead of the filter;
(c) use of the above mentioned circuit for the linearization of oscillator characteristics with respect to those of the filter (e.g. in case a highly linear YIG filter is used);
(d) automatic periodic setting of the tuning control signal to correct possible thermal shifts of the oscillator and/or filter characteristics.

This invention has been described with reference to a presently preferred embodiment, referred to as a non limitative example; it is clear that in practice several changes and modifications could be carried out without departing from the scope of this invention.

Having thus described the present invention, what is claimed is:

1. A circuit for automatically tuning a voltage controlled filter to which the output of an oscillator is applied, said circuit comprising a clock generator for generating clock pulses; a divider circuit connected to the clock generator output for dividing the clock pulses to provide a square wave signal at a lower frequency; a sawtooth circuit connected to receive the square wave signal and to transform the same into a sawtooth signal; a first adder circuit having a first input connected to receive the sawtooth signal, a second input, and an output adapted for connection to the voltage controlled filter for scanning the response of the filter; a radio frequency detector adapted for connection to the output of the filter; a squaring circuit connected to said detector for squaring the output thereof; a switching circuit capable alternatively of assuming a first state in which an output signal is supplied and a second state in which no output signal is supplied, said switching circuit having a first input connected to the output of said divider circuit for receipt of the square wave signal and a second input connected to the output of said squaring circuit for receipt of the squared output, said switching circuit responsive to a signal at its first input for assuming its first state and responsive to a signal at its second input for assuming its second state; a first gating circuit having a first input connected to said clock generator output and a second input connected to said switching circuit output and responsive to simultaneous signals at its first and second inputs for generating an output signal; a first counting circuit connected to the output of said first gating circuit; a second gating circuit having a first input connected to said clock generator output and a second input connected to said squaring circuit for receipt of the squared output and responsive to simultaneous signals at its first and second inputs for generating an output signal; a second counting circuit connected to the output of said second gating circuit; a divide by two circuit having an input connected to the output of said second counter; a subtractor circuit having a first input connected to the output of said first counting circuit and a second input connected to the output of said divide by two circuit; a second adder circuit having a first input connected for receipt of the output of said subtractor circuit, a second input, and an output; a register having a first input connected to said second adder circuit output, a second input connected to the output of said divider circuit, and an output connected to said second adder circuit second input; a digital-to-analog converter having an input connected to the output of said register and an output; a third adder circuit having a first input connected to the output of said digital-to-analog converter, a second input adapted for connection to the oscillator, a third input adapted for connection to a source of frequency offset voltage, and an output connected to the second input of said first adder circuit.

* * * * *